United States Patent
Homma

(10) Patent No.: US 8,942,968 B2
(45) Date of Patent: Jan. 27, 2015

(54) ANALYSIS SUPPORT COMPUTER PRODUCT, APPARATUS, AND METHOD

(75) Inventor: Katsumi Homma, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 975 days.

(21) Appl. No.: 13/073,358

(22) Filed: Mar. 28, 2011

(65) Prior Publication Data

US 2011/0276286 A1 Nov. 10, 2011

(30) Foreign Application Priority Data

May 6, 2010 (JP) ................................. 2010-106790

(51) Int. Cl.
*G06F 17/50* (2006.01)
*G01R 31/28* (2006.01)
*G01R 31/02* (2006.01)

(52) U.S. Cl.
CPC .......... *G01R 31/2894* (2013.01); *G01R 31/025* (2013.01)
USPC ................................................ 703/14; 703/2

(58) Field of Classification Search
USPC .................................. 703/14, 2; 716/132, 133
See application file for complete search history.

(56) References Cited

U.S. PATENT DOCUMENTS

| 7,917,451 | B2* | 3/2011 | Barnett et al. | 705/400 |
| 2007/0106966 | A1* | 5/2007 | Inoue et al. | 716/4 |
| 2009/0031268 | A1* | 1/2009 | Miranda et al. | 716/6 |

FOREIGN PATENT DOCUMENTS

JP 2009-164241 7/2009

* cited by examiner

*Primary Examiner* — Kamini S Shah
*Assistant Examiner* — Luke Osborne
(74) *Attorney, Agent, or Firm* — Staas & Halsey LLP

(57) ABSTRACT

A computer-readable, non-transitory medium stores a program that causes a computer to execute a process including acquiring a unique coefficient that is unique to a device in a circuit under test and is included in a function expressing fluctuation of leak current of the device; detecting as a group and based on the unique coefficient, devices having an identical or similar characteristic; converting first random variables into a single second random variable, the first random variables expressing fluctuation of leak current unique to each of the detected devices; yielding a function that expresses fluctuation of leak current of the detected devices, using the second random variable; and outputting the yielded function.

9 Claims, 10 Drawing Sheets

FIG.6

MESH FLUCTUATION DATA TABLE ~600

| MESH SPACE ID | COORDINATES | CELL ID | NUMBER OF CELLS | COEFFICIENT A | COEFFICIENT B | COEFFICIENT C |
|---|---|---|---|---|---|---|
| M1 | [0,0,0] | ... | N(1) | A(1) | B(1) | C(1) |
| M2 | [0,0,1] | ... | N(2) | A(2) | B(2) | C(2) |
| ... | ... | ... | ... | ... | ... | ... |
| Mj | ... | p[1], p[2], ..., p[X] | N(j) | A(j) | B(j) | C(j) |
| ... | ... | ... | ... | ... | ... | ... |
| Mm | [Na-1, Nb-1, Nc-1] | ... | N(m) | A(m) | B(m) | C(m) |

600-1
600-j
600-m

ANALYSIS SUPPORT COMPUTER PRODUCT, APPARATUS, AND METHOD

CROSS REFERENCE TO RELATED APPLICATIONS

This application is based upon and claims the benefit of priority of the prior Japanese Patent Application No. 2010-106790, filed on May 6, 2010, the entire contents of which are incorporated herein by reference.

FIELD

The embodiments discussed herein are related to leak current analysis of a semiconductor integrated circuit.

BACKGROUND

With the miniaturization of semiconductor integrated circuits, fluctuation of leak current consequent to processing has increased. Leak current is current that flows through a place where the current is not supposed to flow. Leak current aggravates power consumption and heat emission of a circuit, lowering the performance of the circuit. Thus, it is important to correctly estimate leak current when the circuit is designed and to take measures against leak current.

One method for estimating leak current taking account of fluctuation of the leak current is statistical leak current analysis. Statistical leak current analysis creates a model for leak current fluctuation of devices in the circuit. A fluctuation distribution of leak current over the entire circuit is calculated as the sum of fluctuation of leak current from each device in the circuit. As a prior art reference, refer to Japanese Laid-Open Patent Publication No. 2009-164241.

However, according to the conventional technique, a huge number of devices (for example, tens of millions to hundreds of millions devices) are calculated to yield the sum of fluctuation of leak current as a fluctuation distribution of leak current over the entire circuit. Consequently, the processing time for the statistical leak current analysis has increased and the designing period has been lengthened.

SUMMARY

According to an aspect of an embodiment, a computer-readable, non-transitory medium stores a program causing a computer to execute a process that includes acquiring a unique coefficient that is unique to a device in a circuit under test and is included in a function expressing fluctuation of leak current of the device; detecting as a group and based on the unique coefficient, devices having an identical or similar characteristic; converting first random variables into a single second random variable, the first random variables expressing fluctuation of leak current unique to each of the detected devices; yielding a function that expresses fluctuation of leak current of the detected devices, using the second random variable; and outputting the yielded function.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a diagram depicting one example of a mesh fluctuation data table.

DESCRIPTION OF EMBODIMENT(S)

Preferred embodiments of the present invention will be explained with reference to the accompanying drawings.

One example of an analysis support method is explained. A circuit under test is a semiconductor integrated circuit (for example, a processor) that is analyzed for leak current when the circuit is designed. A cell is a device such as a NOT gate, an AND gate, a NAND gate, an OR gate, wiring, a buffer, an inverter (INV), and a FF that are included in the circuit under test.

Fluctuation of leak current of cells in the circuit under test includes a first fluctuation that is unique to each cell, and a second fluctuation that is common to all cells. Therefore, the fluctuation of the leak current can be expressed as a function of fluctuation parameters based on a gate length, a gate width, etc. of a transistor in a cell as shown in equation (1) below.

$l_c$ denotes fluctuation of leak current of a cell. $\alpha$ denotes a first fluctuation parameter concerning the first fluctuation. $\beta$ denotes a second fluctuation parameter concerning the second fluctuation. $\alpha$ and $\beta$ are random variables and follow, for example, a standard normal distribution having expected value of zero and variance of one. a, b, and c are coefficients unique to each cell.

$$l_c = \exp(a + b \times \alpha + c \times \beta) \tag{1}$$

Figure 1:
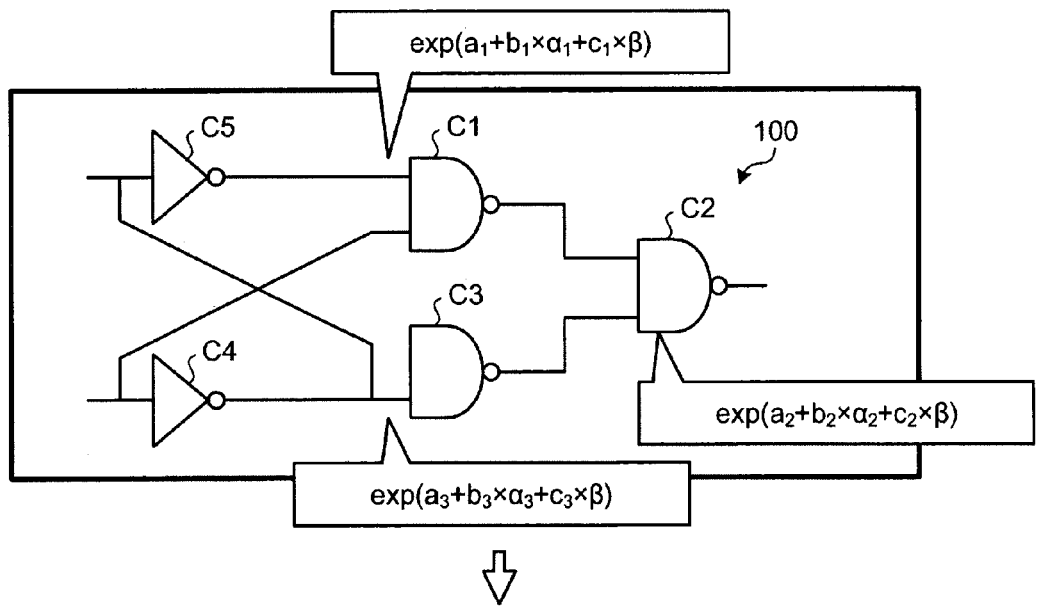
FIG. 1 is a diagram depicting one example of an analysis support method.

With reference to FIG. 1, one example of the analysis support method is explained. FIG. 1 is a diagram depicting one example of the analysis support method. In FIG. 1, a circuit under test 100 includes cells $C_1$ to $C_5$. FIG. 1 depicts only part of the circuit under test 100. For simplicity, it is assumed here that cells $C_1$ to $C_3$ are cells in the circuit under test 100.

In this case, the fluctuation of leak current of the circuit under test 100 is expressed as the sum of fluctuation of leak current of cells $C_1$ to $C_3$ as shown in equation (2) where L denotes the fluctuation of leak current of the circuit under test 100, $l_{C_1}$ denotes fluctuation of leak current of cell $C_1$, $l_{C_2}$ denotes fluctuation of leak current of cell $C_2$, and $l_{C_3}$ denotes fluctuation of leak current of cell $C_3$.

$$L = l_{C_1} + l_{C_2} + l_{C_3} = \exp(a_1 + b_1 \times \alpha_1 + c_1 \times \beta) + \exp(a_2 + b_2 \times \alpha_2 + c_2 \times \beta) + \exp(a_3 + b_3 \times \alpha_3 + c_3 \times \beta) \tag{2}$$

Cells $C_1$ to $C_3$ form a cell group having an identical or similar characteristic. For example, cells $C_1$ to $C_3$ are NAND gates having identical driving capability. A cell group having an identical characteristic indicates, for example, a cell group where types (functions) of cells are identical and the driving capability of cells is identical. A cell group having a similar characteristic indicates, for example, a cell group where types of cells are identical and the difference in the driving capability of cells falls within a given range.

Cells having an identical or similar characteristic have identical or nearly identical coefficients a, b, and c. As an example, coefficients $a_1$ to $a_3$ are identical, coefficients $b_1$ to $b_3$ are identical, and coefficients $c_1$ to $c_3$ are identical in equation (2).

(i) In this method, coefficients $a_1$ to $a_3$, $b_1$ to $b_3$, and $c_1$ to $c_3$ are replaced with coefficients a, b, and c where $a=a_1=a_2=a_3$, $b=b_1=b_2=b_3$, and $c=c_1=c_2=c_3$. As a result, equation (2) is written as equation (3) below.

$$L=\exp(a+b\times\alpha_1+c\times\beta)+\exp(a+b\times\alpha_2+c\times\beta)+\exp(a+b\times\alpha_3+c\times\beta)=\exp(a)\times\{\exp(b\times\alpha_1)+\exp(b\times\alpha_2)+\exp(b\times\alpha_3)\}\times\exp(c\times\beta) \quad (3)$$

(ii) In this method, the first fluctuation parameters $\alpha_1$, $\alpha_2$, and $\alpha_3$ included in equation (3) are converted into one first fluctuation parameter $\alpha$. For example, by a mathematical approximation scheme, terms including $\alpha_1$, $\alpha_2$, and $\alpha_3$ are converted as shown in equation (4) below where A is defined by equation (5) and $B^2$ is defined by equation (6).

$$\exp(b\times\alpha_1)+\exp(b\times\alpha_2)+\exp(b\times\alpha_3)\approx\exp(A+B\times\alpha) \quad (4)$$

$$A=(\tfrac{1}{2})\times\log\left[3^3\exp(b^2)/\{\exp(b^2)+3-1\}\right] \quad (5)$$

$$B^2=\log\{(\exp(b^2)+3-1)/3\} \quad (6)$$

(iii) In this method, a function expressing the fluctuation of leak current of the circuit under test 100 (cells $C_1$ to $C_3$) is acquired using the first fluctuation parameter $\alpha$ in which multiple first fluctuation parameters $\alpha_1$, $\alpha_2$, and $\alpha_3$ are reflected. As a result, equation (3) is written as equation (7).

$$L=\exp(a)\times\exp(A+B\times\alpha)\times\exp(c\times\beta)=\exp(a+A+B\times\alpha+c\times\beta) \quad (7)$$

According to the method explained above, cells in the circuit under test are classified into cell groups based on identical or similar characteristics; whereby the number of terms in the function (polynomial) that expresses fluctuation of leak current is reduced. As a result, the processing time consumed for the statistical leak current analysis of the circuit under test can be shortened. In the example of the conversion from equation (3) to equation (7), three terms concerning an exponential function are reduced to one term.

Figure 2:
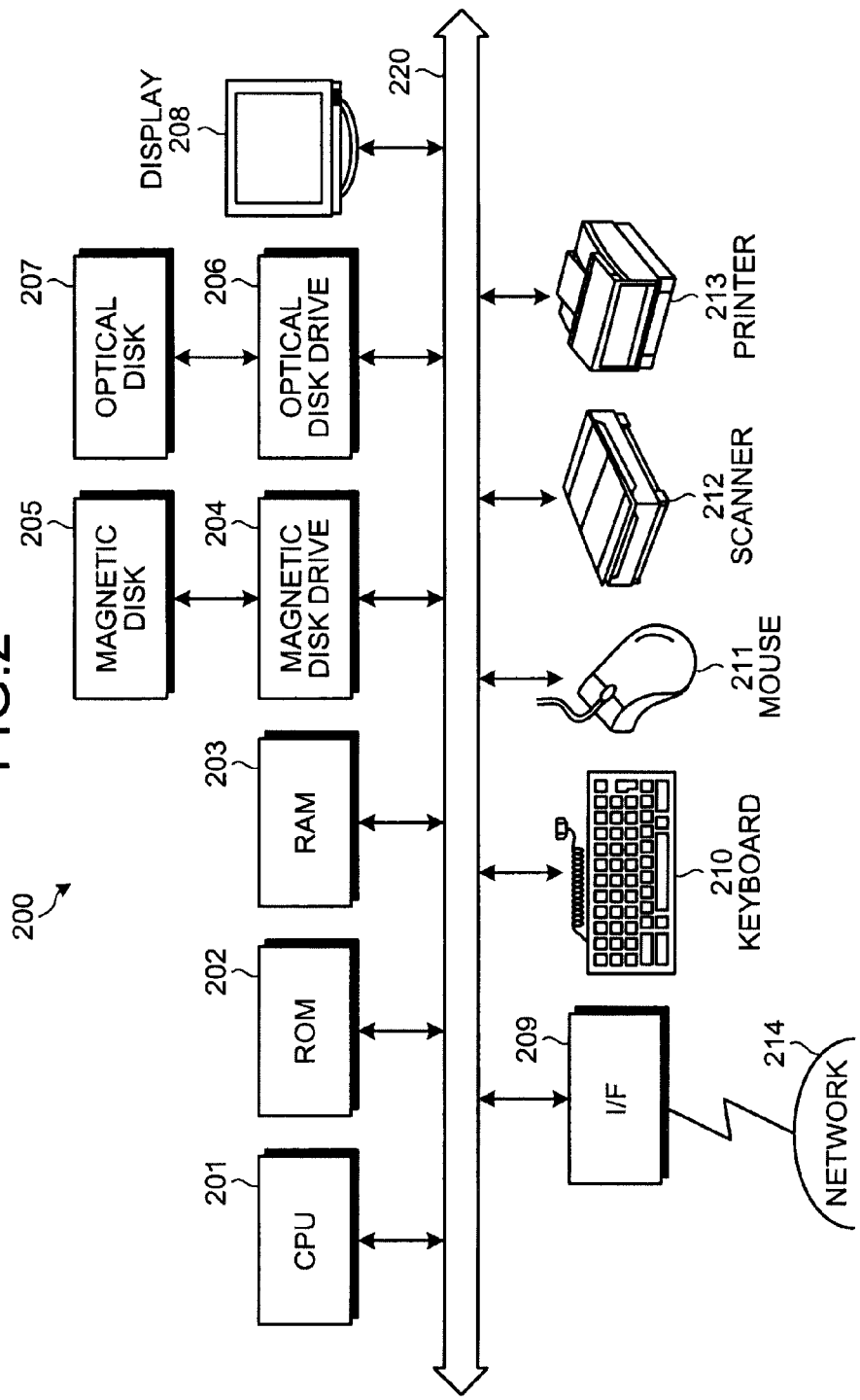
FIG. 2 is a block diagram depicting one example of a hardware configuration of an analysis support apparatus.

A hardware configuration of an analysis support apparatus 200 according to the embodiments is explained. FIG. 2 is a block diagram depicting one example of a hardware configuration of an analysis support apparatus. The analysis support apparatus 200 includes a central processing unit (CPU) 201, a read-only memory (ROM) 202, a random access memory (RAM) 203, a magnetic disk drive 204, a magnetic disk 205, an optical disk drive 206, an optical disk 207, a display 208, an interface (I/F) 209, a keyboard 210, a mouse 211, a scanner 212, and a printer 213, connected to one another by way of a bus 220.

The CPU 201 governs overall control of the analysis support apparatus 200. The ROM 202 stores therein programs such as a boot program. The RAM 203 is used as a work area of the CPU 201. The magnetic disk drive 204, under the control of the CPU 201, controls reading/writing of data from or to the magnetic disk 205. The magnetic disk 205 stores therein the data written under the control of the magnetic disk drive 204.

The optical disk drive 206, under the control of the CPU 201, controls the reading and writing of data with respect to the optical disk 207. The optical disk 207 stores therein the data written under the control of the optical disk drive 206, the data being read by the computer.

The display 208 displays a cursor, an icon, or a toolbox as well as data such as documents, images, and information on functions. The display 208 may be, for example, a cathode ray tube (CRT), a thin-film-transistor (TFT) liquid crystal display, or a plasma display.

The I/F 209 is connected to a network 214 such as the Local Area Network (LAN), the Wide Area Network (WAN), and the Internet through a telecommunication line and is connected to other devices by way of the network 214. The I/F 209 manages the network 214 and an internal interface, and controls the input and output of data from or to external devices. The I/F 209 may be, for example, a modem or a LAN adapter.

The keyboard 210 is equipped with keys for the input of characters, numerals, and various instructions, and data is entered through the keyboard 210. The keyboard 210 may be a touch-panel input pad or a numeric keypad. The mouse 211 performs cursor movement, range selection, and movement, size change, etc., of a window. The mouse 211 may be a trackball or a joystick provided the trackball or joystick has similar functions as a pointing device.

The scanner 212 optically reads an image and takes in the image data into the analysis support apparatus 200. The scanner 212 may have an optical character recognition (OCR) function as well. The printer 213 prints image data and document data. The printer 213 may be, for example, a laser printer or an ink jet printer.

The contents of a cell fluctuation data table 300 used by an analysis support apparatus 200 is explained. The cell fluctuation data table 300 is implemented by, for example, a storage device such as the RAM 203, the magnetic disk 205, and the optical disk 207 depicted in FIG. 2.

Figure 3:
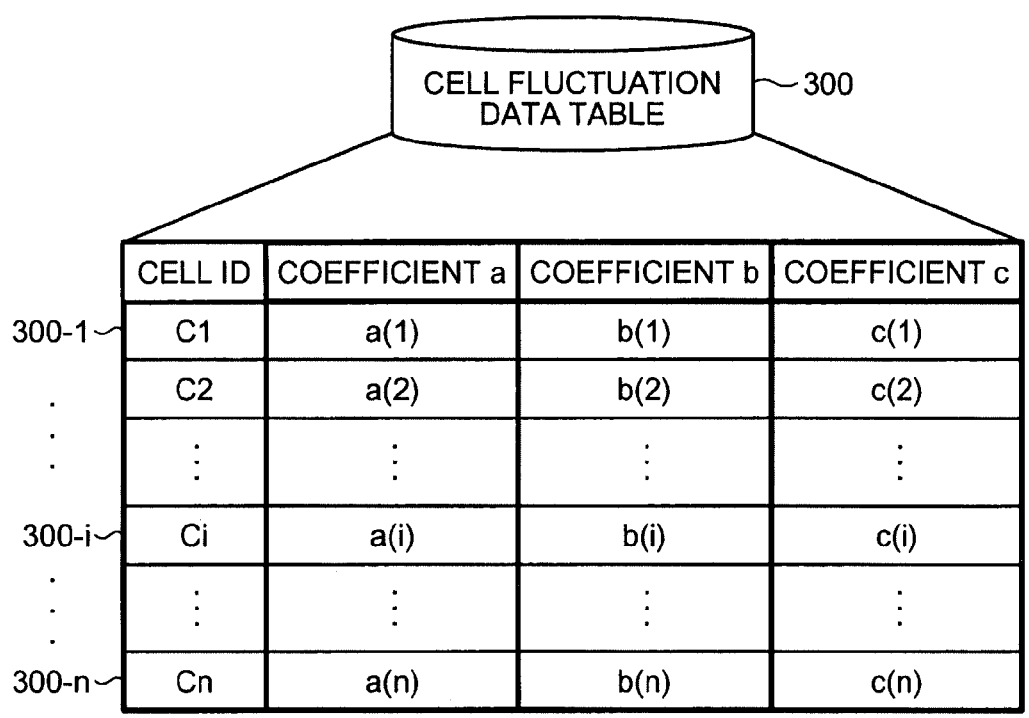
FIG. 3 is a diagram depicting one example of the contents of a cell fluctuation data table.

FIG. 3 is a diagram depicting one example of the content of a cell fluctuation data table. In FIG. 3, the cell fluctuation data table 300 includes fields of cell ID, coefficient a, coefficient b, and coefficient c. Information is set in each field so that cell fluctuation data 300-1 to 300-$n$ for each cell $C_1$ to $C_n$ are stored as records.

The cell ID is an identifier for cell $C_i$ in the circuit under test (i=1, 2, ..., n). Coefficients a, b, and c form a coefficient group included in equation (1). Cell $C_i$ as an example has a coefficient group $\{a(i), b(i), c(i)\}$.

Figure 4:
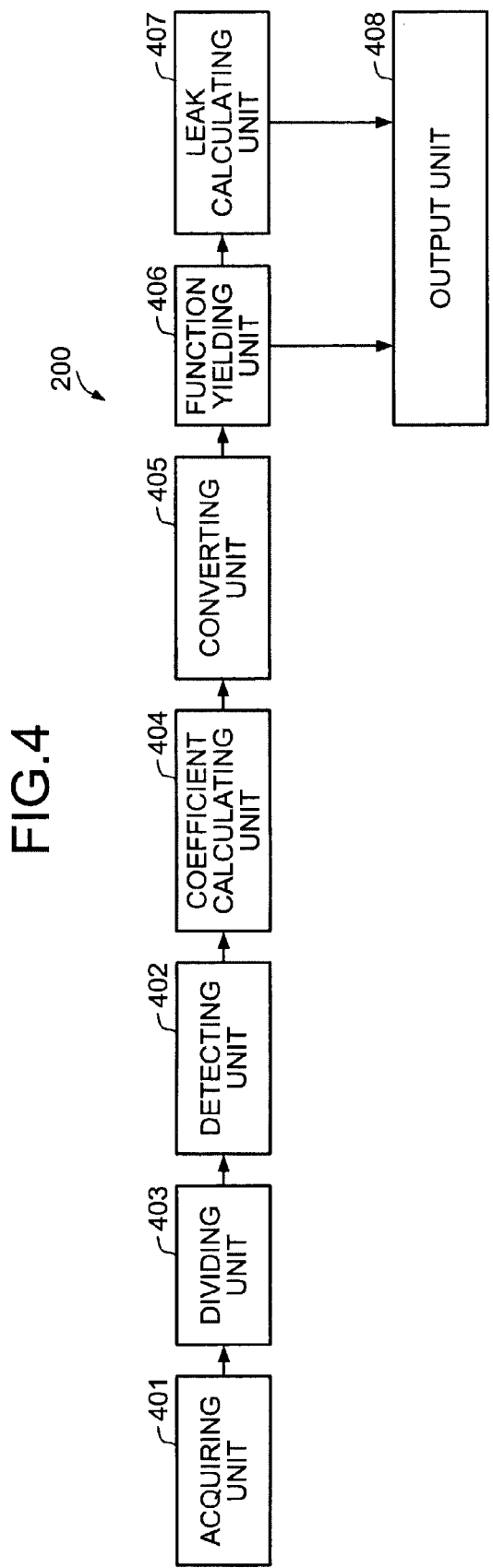
FIG. 4 is a block diagram depicting one example of a functional configuration of an analysis support apparatus.

A functional configuration of the analysis support apparatus 200 is explained. FIG. 4 is a block diagram depicting one example of a functional configuration of an analysis support apparatus. In FIG. 4, the analysis support apparatus 200 includes an acquiring unit 401, a detecting unit 402, a dividing unit 403, a coefficient calculating unit 404, a converting unit 405, a function yielding unit 406, a leak calculating unit 407, and an output unit 408.

Each functional unit (acquiring unit 401 to output unit 408) is implemented by the CPU 201 executing a program stored in a storage device such as the ROM 202, the RAM 203, the magnetic disk 205, and the optical disk 207, or implemented by the I/F 209. Output from each functional unit (acquiring unit 401 to output unit 408) are stored to a storage device such as the RAM 203, the magnetic disk 205, and the optical disk 207 except as otherwise specifically explained.

The acquiring unit 401 acquires, for each cell $C_i$ in the circuit under test, coefficients unique to the cell $C_i$ included in a function expressing fluctuation of leak current of cell $C_i$. The function expressing fluctuation of leak current of cell $C_i$ is, for example, a probability density function expressed by equation (1) above. Coefficients unique to a cell $C_i$ are coefficient group $\{a, b, c\}$ included in equation (1) above.

For example, the acquiring unit 401 acquires cell fluctuation data 300-1 to 300-$n$ through a user input operation via the keyboard 210 or the mouse 211. The acquiring unit 401 may acquire the cell fluctuation data 300-1 to 300-$n$ by extracting the data from a database or library (not depicted). The acquired data 300-1 to 300-$n$ are stored in, for example, the cell fluctuation data table 300 depicted in FIG. 3.

The detecting unit 402, from among cells $C_1$ to $C_n$ in the circuit under test and based on coefficients unique to acquire cell $C_i$, detects a cell group having an identical or similar characteristic. The characteristic is, for example, determined by the type or driving capability of cell $C_i$ such as a NOT gate, an AND gate, a wiring, a buffer, an INV, and a FF.

Figure 5:
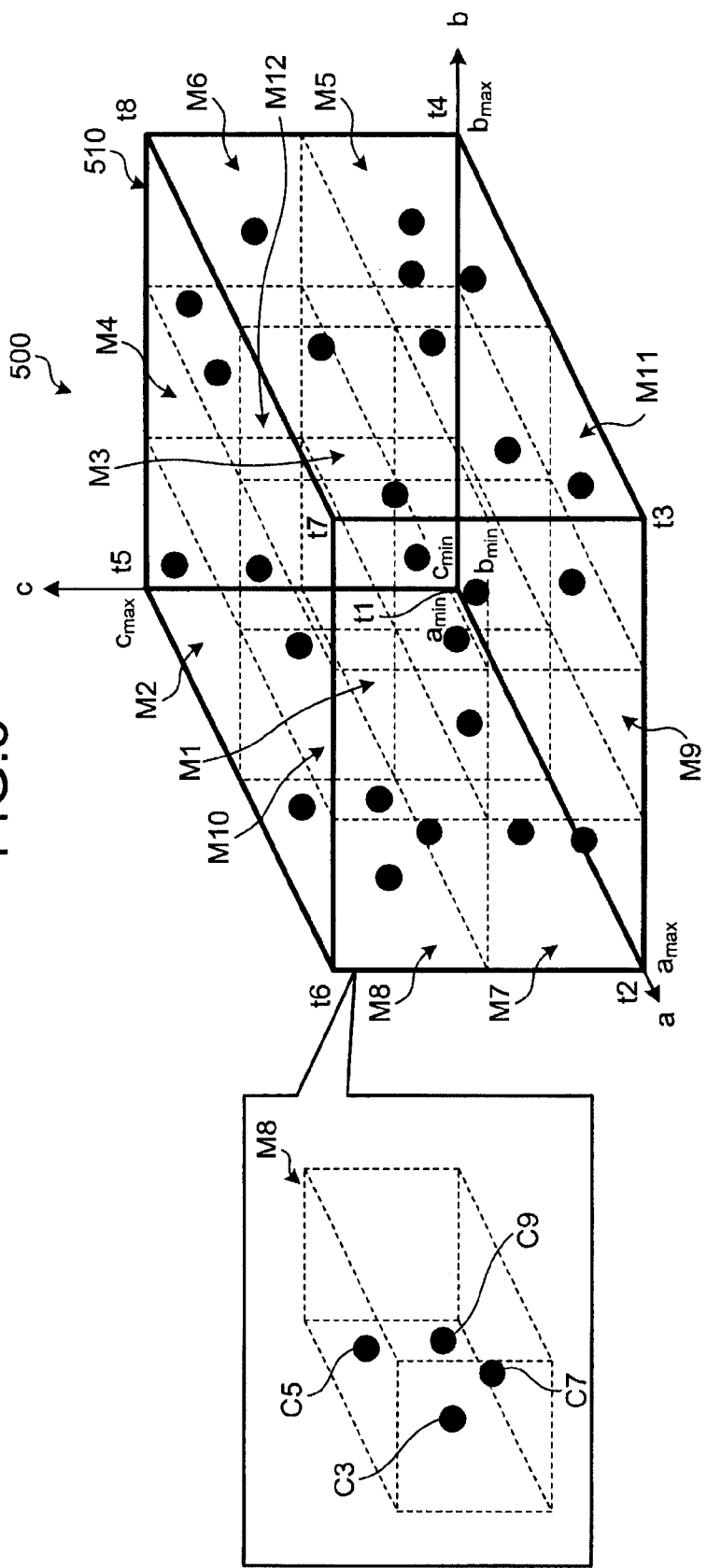
FIG. 5 is a diagram depicting a process of a detecting unit.

Cells having an identical or a similar characteristic have identical or nearly identical coefficients. The detecting unit 402 detects, from among cells $C_1$ to $C_n$, a cell group having identical or similar coefficients unique to cell $C_i$ as a cell group in which characteristics of cells are identical or similar. With reference to FIG. 5, one example of a process of the detecting unit 402 is explained.

FIG. 5 is a diagram depicting a process of the detecting unit. In FIG. 5, an abc coordinate system 500 is an orthogonal coordinate system having a-axis, b-axis, and c-axis. The a-axis depicts a value of coefficient a in equation (1) above. The b-axis depicts a value of coefficient b in equation (1) above. The c-axis depicts a value of coefficient c in equation (1) above.

The dividing unit 403 divides an interval from the minimum to the maximum of coefficients a, b, and c based on dividing number $N_a$, $N_b$, and $N_c$. The dividing number $N_a$ is a number indicating how many segments an interval between the minimum to the maximum of coefficient a is divided into. The dividing number $N_b$ is a number indicating how many segments an interval between the minimum and the maximum of coefficient b is divided into. The dividing number $N_c$ is a number indicating how many segments an interval between the minimum to the maximum of coefficient c is divided into.

The dividing numbers $N_a$, $N_b$, and $N_c$ are set beforehand and stored in a storage device such as the ROM 202, the RAM 203, the magnetic disk 205, and the optical disk 207. The acquiring unit 401 may acquire the dividing numbers $N_a$, $N_b$, and $N_c$ through a user input operation via the keyboard 210 or the mouse 211.

However, a tradeoff exists in that as the dividing numbers $N_a$, $N_b$, and $N_c$ become larger, leak current can be acquired more accurately but the processing time for analysis becomes longer. Consequently, the user appropriately sets the dividing numbers $N_a$, $N_b$, and $N_c$ in light of, for example, the time period for designing the circuit under test.

The dividing unit 403 equally divides an interval between the minimum and the maximum of coefficients a to c according to the dividing numbers $N_a$, $N_b$, and $N_c$. As a result, each axis (a-axis, b-axis, c-axis) is divided into multiple segments. In this case, lengths (hereinafter "mesh width") of each segment of a- to c-axes are expressed by equations (8) to (10) below.

$h_a$, $h_b$, and $h_c$ are mesh widths of a-axis, b-axis, and c-axis. $a_{max}$ and $a_{min}$ are the maximal value and the minimal value of coefficients a(1) to a(n) of cells $C_1$ to $C_n$. $b_{max}$ and $b_{min}$ are the maximal value and the minimal value of coefficients b(1) to b(n) of cells $C_1$ to $C_n$. $c_{max}$ and $c_{min}$ are the maximal value and the minimal value of coefficients c(1) to c(n) of cells $C_1$ to $C_n$. $N_a$, $N_b$, and $N_c$ are dividing numbers.

$$h_a=(a_{max}-a_{min})/N_a \quad (8)$$

$$h_b=(b_{max}-b_{min})/N_b \quad (9)$$

$$h_c=(c_{max}-c_{min})/N_c \quad (10)$$

For example, consider a case where $N_a=2$, $N_b=3$, and $N_c=2$. In this case, an interval between $a_{min}$ and $a_{max}$ on a-axis is divided equally into two segments. An interval between $b_{min}$ and $b_{max}$ on b-axis is divided equally into three segments. An interval between $c_{min}$ and $c_{max}$ on c-axis is divided equally into two segments.

In the abc coordinate system 500, a space 510 having vertices $t_1$ to $t_8$ is considered (hexahedron enclosed by heavy line in FIG. 5). Coordinates of vertices are as follows: $t_1$ ($a_{min}$, $b_{min}$, $c_{min}$) $t_2$ ($a_{max}$, $b_{min}$, $c_{min}$) $t_3$ ($a_{max}$, $b_{max}$, $c_{min}$) $t_4$ ($a_{min}$, $b_{max}$, $c_{min}$) $t_5$ ($a_{min}$, $b_{min}$, $c_{max}$), $t_6$ ($a_{max}$, $b_{min}$, $c_{max}$), $t_7$ ($a_{max}$, $b_{max}$, $c_{max}$), $t_8$ ($a_{min}$, $b_{max}$, $c_{max}$).

The space 510 is divided by a plane that includes a dividing point on a-axis and is parallel with a plane formed by b-axis and c-axis. The space 510 is divided by a plane that includes a dividing point on b-axis and is parallel with a plane formed by a-axis and c-axis. The space 510 is divided by a plane that includes a dividing point on c-axis and is parallel with a plane formed by a-axis and b-axis.

As a result, the space 510 is divided into multiple cubes or cuboids (hereinafter "mesh space $M_1$ to $M_m$") in the abc coordinate system 500. In the example of FIG. 5, the space 510 is divided into the mesh space $M_1$ to $M_{12}$ (m=$N_a \times N_b \times N_c$=12) in the abc coordinate system 500.

Coordinates of a mesh space $M_j$ (j=1, 2, ..., m) in the abc coordinate system 500 is expressed as equation (11) below where $r_a$ represents an a-coordinate in the mesh space $M_j$ (the range of coefficient a), $r_b$ represents a b-coordinate in the mesh space $M_j$ (the range of coefficient b), and $r_c$ represents a c-coordinate in the mesh space $M_j$ (the range of coefficient c). $r_a$, $r_b$, and $r_c$ are natural numbers including zero (0, 1, 2, ...).

$$[r_a, r_b, r_c]=[a_{min}+r_a \times h_a \leq a < a_{min}+(r_a+1) \times h_a, b_{min}+r_b \times h_b \leq b < b_{min}+(r_b+1) \times h_b, c_{min}-r_c \times h_c \leq c < c_{min}+(r_c+1) \times h_c] \quad (11)$$

For example, the coordinates of the mesh space $M_1$ is expressed as [0, 0, 0]=[$a_{min} \leq a < a_{min}+h_a$, $b_{min} \leq b < b_{min}+h_b$, $c_{min} \leq c < c_{min}+h_c$]. The coordinates of the mesh space $M_8$ is expressed as [1, 0, 1]=[$a_{min}+h_a \leq a < a_{min}+2h_a$, $b_{min} \leq b < b_{min}+h_b$, $c_{min}+h_c \leq c < c_{min}+2h_c$].

The detecting unit 402 detects, as a cell group having an identical or similar characteristic, cells that are included in a mesh space $M_j$ when cells $C_i$ are plotted in the abc coordinate system 500, based on coefficients a, b, and c. In other words, a cell group having an identical or similar characteristic is detected as a mesh space since those having nearly equal values of coefficients a, b, and c belong to the same mesh space $M_j$.

As an example, for the mesh space $M_8$, the detecting unit 402 detects from among cells $C_1$ to $C_n$, a cell group that satisfies equation (12) below for coefficient a, satisfies equation (13) below for coefficient b, and satisfies equation (14) below for coefficient c. In the example of FIG. 5, cells $C_3$, $C_5$, $C_7$, and $C_9$ included in the mesh space $M_8$ are detected as a cell group having an identical or similar characteristic.

$$a_{min}+h_a \leq a < a_{min}+2h_a \quad (12)$$

$$b_{min} \leq b < b_{min}+h_b \quad (13)$$

$$c_{min}+h_c \leq c < c_{min}2h_c \quad (14)$$

Results of the detection are stored in, for example, a mesh fluctuation data table 600 depicted in FIG. 6. The mesh fluctuation data table 600 is implemented by, for example, a storage device such as the RAM 203, the magnetic disk 205, and the optical disk 207.

FIG. 6 is a diagram depicting one example of a mesh fluctuation data table. In FIG. 6, the mesh fluctuation data table 600 includes fields of mesh space ID, coordinates, cell ID, the number of cells, coefficient A, coefficient B, and coefficient C. Information is set in each field so that mesh fluctuation data 600-1 to 600-$m$ for each mesh space $M_1$ to $M_m$ are stored as records.

The mesh space ID is an identifier for mesh space $M_j$ ($j=1, 2, \ldots, m$). Coordinates indicate coordinates of mesh space $M_j$ in the abc coordinate system 500. The cell ID is an identifier for cell $C_i$ included in the mesh space $M_j$. In the explanation below, cell $C_i$ included in the mesh space $M_j$ is expressed as "cell p[1], cell p[2], . . . , cell p[X]".

The number of cells indicates the number of cells X included in the mesh space $M_j$. Coefficients A, B, and C are coefficients included in equation (23) below that expresses fluctuation of leak current of cells p[1] to p[X] in the mesh space $M_j$. A detailed explanation of coefficient A, coefficient B, and coefficient C will be given later.

For example, it is assumed that the detecting unit 402 has detected cells $C_3$, $C_5$, $C_7$, and $C_9$ in the mesh space $M_8$. In this case, cell IDs for "$C_3$, $C_5$, $C_7$, $C_9$" are set in the "cell ID" field of the mesh space $M_8$ in the mesh fluctuation data table 600, and "4" is set in the "the number of cells" field.

Explanation returns to FIG. 4. The coefficient calculating unit 404 calculates a coefficient common to all cells $C_i$ in a cell group, based on coefficients respectively unique to the cells $C_i$ included in the detected cell group. For example, the coefficient calculating unit 404 calculates a coefficient common to cells p[1] to p[X] using equations (15) to (17) below.

$g_a(j)$ denotes a value of coefficient a common to cells p[1] to p[X] in the mesh space $M_j$. $g_b(j)$ denotes a value of coefficient b common to cells p[1] to p[X] in the mesh space $M_j$. $g_c(j)$ denotes a value of coefficient c common to cells p[1] to p[X] in the mesh space M.

X denotes the number of cells included in the mesh space $M_j$. $p_a[1]$ to $p_a[X]$ denote values of coefficient a of each cell p[1] to p[X]. $p_b[1]$ to $p_b[X]$ denote values of coefficient b of each cell p[1] to p[X]. $p_c[1]$ to $p_c[X]$ denote values of coefficient c of each cell p[1] to p[X].

$$g_a(j)=(p_a[1]+p_a[2]+\ldots+p_a[X])/X \qquad (15)$$

$$g_b(j)=(p_b[1]+p_b[2]+\ldots+p_b[X])/X \qquad (16)$$

$$g_c(j)=(p_c[1]+p_c[2]+\ldots+p_c[X])/X \qquad (17)$$

In the example of the mesh space $M_8$, the value of coefficient a common to cells $C_3$, $C_5$, $C_7$, and $C_9$ included in the mesh space $M_8$ is given by "$g_a(8)=\{a(3)+a(5)+a(7)+a(9)\}/4$". The value of coefficient b common to cells $C_3$, $C_5$, $C_7$, and $C_9$ included in the mesh space $M_8$ is given by "$g_b(8)=\{b(3)+b(5)+b(7)+b(9)\}/4$". The value of coefficient c common to cells $C_3$, $C_5$, $C_7$, and $C_9$ included in the mesh space $M_8$ is given by "$g_c(8)=\{c(3)+c(5)+c(7)+c(9)\}/4$".

In other words, the average of the coefficients a, b, and c (centroid of mesh space $M_j$) is used as values of coefficients a, b, and c common to cells p[1] to p[X]. However, coordinates of the center of the mesh space $M_j$ or coordinates of an arbitrary point in the mesh space $M_j$ may be set to the values of coefficients a, b, and c common to cells p[1] to p[X]. When the mesh space $M_j$ includes no cell $C_i$, coefficients $g_a(j)$, $g_b(j)$, $g_c(j)$ are not calculated.

The converting unit 405 converts random variables denoting fluctuation of leak current unique to each cell $C_i$ of the detected cells into one random variable. For example, the converting unit 405 converts coefficients $p_a[1]$ to $p_a[X]$, $p_b[1]$ to $p_b[X]$, $p_c[1]$ to $p_c[X]$ unique to each cell p[1] to p[X] into coefficients $g_a(j)$, $g_b(i)$, $g_c(j)$ common to cells p[1] to p[X].

The fluctuation of leak current of cells p[1] to p[X] in the mesh space $M_j$ is expressed by equation (18) below where $l_{Mj}$ denotes fluctuation of leak current of cells p[1] to p[X] in the mesh space $M_j$. $\alpha_{[x]}$ denotes a first fluctuation parameter unique to cell p[x] (x=1, 2, . . . , X). $\beta$ denotes a second fluctuation parameter common to all cells $C_1$ to $C_n$ in the circuit under test.

$$l_{Mj}=\exp(p_a[1]+p_b[1]\times\alpha_{[1]}+p_c[1]\times\beta)+\exp(p_a[2]+p_b[2]\times\alpha_{[2]+pc}[2]\times\beta)+\ldots+\exp(p_a[X]+p_b[X]\times\alpha_{[x]}+p_c[X]\times\beta) \qquad (18)$$

As a result, when the converting unit 405 converts $p_a[x]$, $p_b[x]$, $p_c[x]$ into $g_a(j)$, $g_b(j)$, $g_c(j)$, equation (18) is converted into equation (19) below.

$$l_{Mj}=\exp(g_a(j))\times\{\exp(g_b(j)\times\alpha_{[1]})+\exp(g_b(j)\times\alpha_{[2]})+\ldots+\exp(g_b(j)\times\alpha_{[X]})\}\times\exp(g_c(j)\times\beta) \qquad (19)$$

The converting unit 405 converts X first fluctuation parameters $\alpha_{[1]}$ to $\alpha_{[x]}$ in equation (19) into one first fluctuation parameter $\alpha_j$. For example, the converting unit 405 converts terms including the first fluctuation parameters $\alpha_{[1]}$ to $\alpha_{[x]}$ in equation (19) into equation (20) below using Wilkinson's approximation where A(j) is defined as equation (21) and B(j)² is defined in equation (22). A detailed explanation of Wilkinson's approximation will be given later.

$$\exp(g_b(j)\times\alpha_{[1]})+\exp(g_b(j)\times\alpha_{[2]})+\ldots+\exp(g_b(j)\times\alpha_{[x]})\approx\exp\{A(j)+B(j)\times\alpha_j\} \qquad (20)$$

$$A(j)=g_a(j)+(\tfrac{1}{2})\times\log[N(j)^3\times\exp(g_b(j)^2)/\{\exp(g_b(j)^2)+N(j)-1\}] \qquad (21)$$

$$B(j)^2=\log\{(\exp(g_b(j)^2)+N(j)-1)/N(j)\} \qquad (22)$$

Results of the conversion are, for example, stored in the mesh fluctuation data table 600 depicted in FIG. 6. Specifically, A(j) and B(j) in equation (20) are set respectively in the "coefficient A" field and the "coefficient B" field of the mesh space $M_j$ in the mesh fluctuation data table 600.

The function yielding unit 406 yields a function that expresses fluctuation of leak current of cells, using converted random variables. For example, the function yielding unit 406 yields equation (23) below that expresses fluctuation of leak current of cells p[1] to p[X], using the first fluctuation parameter $\alpha_j$. C(j) can also be written as $g_c(j)$. $\beta$ is the second fluctuation parameter common to all cells $C_1$ to $C_n$ in the circuit under test.

$$l_{Mj}=\exp\{A(j)+B(j)\times\alpha_j+C(j)\times\beta\} \qquad (23)$$

C(j) in equation (23) is set in the "coefficient C" field of the mesh space $M_j$ in the mesh fluctuation data table 600.

The leak calculating unit 407 calculates leak current of the circuit under test based on the function acquired. For example, the leak calculating unit 407 performs statistical leak current analysis based on the mesh fluctuation data 600-1 to 600-$m$ in the mesh fluctuation data table 600.

The leak calculating unit 407 may transfer the mesh fluctuation data 600-1 to 600-$m$ to a simulator (not depicted) to perform the statistical leak current analysis. In this case, the leak calculating unit 407 acquires a result of the analysis from an external simulator.

For example, the leak calculating unit 407 performs a Monte Carlo simulation based on the mesh fluctuation data 600-1 to 600-$m$. In the calculation, since coefficient terms of cells having an identical or similar characteristic are reduced to fewer terms, a great amount of calculation for generation of random numbers, calculation of exponents, multiplication, addition, etc. is reduced and the processing time is shortened.

The output unit 408 outputs calculated leak current of the circuit under test. For example, the output unit 408 may output an analysis result 700 of the statistical leak current analysis depicted in FIG. 7. Examples of the form of output include display on the display 208, a printout from the printer 213, and the transmission to an external device via the I/F 209. The result may be stored to a storage area such as the RAM 203, the magnetic disk 205, and the optical disk 207.

Figure 7:
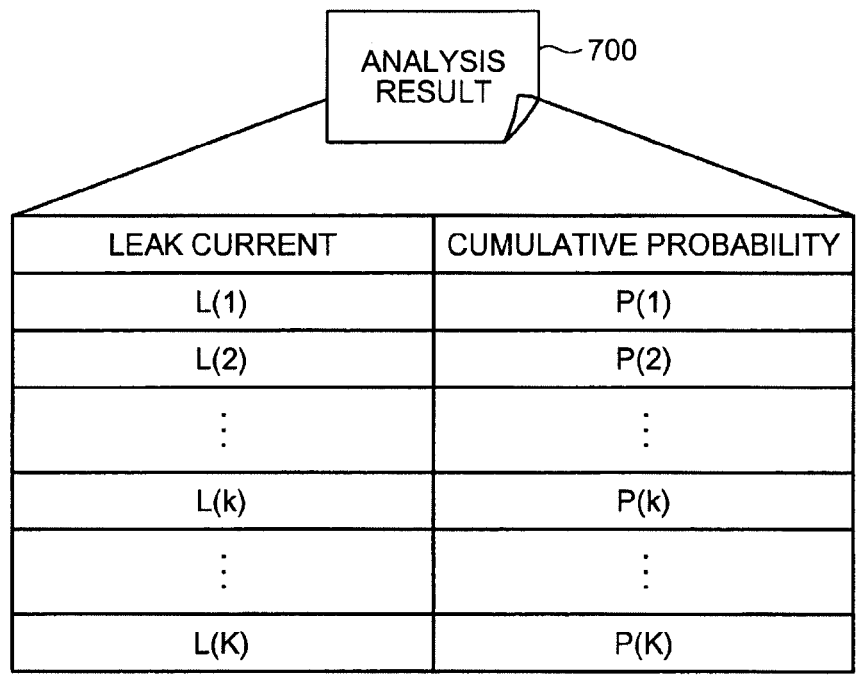
FIG. 7 is a diagram depicting one example of an analysis result.

FIG. 7 is a diagram depicting one example of the analysis result. In FIG. 7, the analysis result 700 includes cumulative probabilities P(1) to P(K) corresponding to leak current L(1) to L(K) of the circuit under test. Cumulative probability P(k) corresponding to leak current L(k) indicates a probability that leak current is at most L(k) (k=1, 2, . . . , K).

The output unit 408 may output a function that has been yielded at the function yielding unit 406 and expresses fluctuation of leak current of cells. For example, the output unit 408 outputs the mesh fluctuation data 600-1 to 600-$m$ in the mesh fluctuation data table 600. Once the data is output, an external simulator can perform the statistical leak current analysis at any time.

In the above explanation, the dividing unit 403 divides an interval between the minimum and the maximum of each of coefficients a, b, and c by the dividing numbers $N_a$, $N_b$, and $N_c$ equally but the embodiment is not limited to this example. For example, the dividing unit 403 may divide an interval between the minimum and the maximum of coefficient a by the dividing number $N_a$ so that a typical value of leak current is divided equally according to the dividing number $N_a$.

A typical value of leak current indicates leak current of cell $C_i$ where a fluctuation component of leak current is removed. In other words, the typical value of leak current indicates leak current of equation (1) in which $\alpha=\beta=0$. As a result, a typical value $l_{typ}$ of leak current of cell $C_i$ is given by equation (24) below.

$$l_{typ} = \exp(a) \qquad (24)$$

The dividing unit 403 divides, with respect to coefficient a, an interval between the minimum ($\exp(a_{min})$) and the maximum ($\exp(a_{max})$) of the typical value equally by the dividing number $N_a$. With respect to coefficients b and c, the dividing unit 403 divides an interval between the minimum and the maximum of each of coefficients b and c equally by the dividing numbers $N_b$ and $N_c$. In this case, the mesh width $h_a$ of a-axis is expressed by equation (25) below and the coordinates of the mesh space $M_j$ are written as equation (26).

$$h_a = \{\exp(a_{max}) - \exp(a_{min})\}/N_a \qquad (25)$$

$$[r_a, r_b, r_c] = [\log\{\exp(a_{min})\} + r_a \times h_a] \le a < [\log\{\exp(a_{min})\} + (r_a+1) \times h_a], b_{min} + r_b \times h_b \le b < b_{min} + (r_b+1) \times h_b, c_{min} + r_c \times h_c \le c < c_{min} + (r_c+1) \times h_c] \qquad (26)$$

By dividing an interval of a typical value of leak current into equal lengths, cells having identical or similar values of leak current can be detected as a cell group having an identical or similar characteristic in comparison with a case where an interval between the minimum and the maximum of coefficient a is divided into identical lengths. As a result, leak current can be detected more accurately.

In the above explanation, coefficients a, b, and c unique to each cell $C_i$ are focused on to detect cells having an identical or similar characteristic but the embodiment is not limited hereto. For example, the detecting unit 402 may detect a cell group in which values of one of coefficients a, b, and c are identical or nearly identical as a cell group having an identical or similar characteristic. For example, the dividing unit 403 divides an interval between the minimum and the maximum of coefficient a unique to each cell $C_i$ by the dividing number $N_a$. The detecting unit 402 detects cells having coefficients a falling within the same segment as a cell group having an identical or similar characteristic.

Wilkinson's approximation is explained here. In Wilkinson's approximation, the sum of independent log-normal random variables is approximated by one log-normal random variable $e^z$ (z: normal random variable). More specifically, according to Wilkinson's approximation, the average and the standard deviation of Z in equation (27) below is determined such that the averages and the standard deviations of both sides of equation (27) are equal. $Y_i$ (i=1, 2, . . . , n) are independent normal random variables.

$$e^{Y_1} + e^{Y_2} + \ldots + e^{Y_n} \approx e^Z \qquad (27)$$

New notation is introduced here: $m_i$ expresses the average of normal random variable $Y_i$, and $\sigma_i$ the standard deviation. The average of the left hand side of equation (27) is written as equation (28) and the deviation as equation (29), where M denotes the average of a distribution on the left hand side of equation (27) and V denotes the deviation of a distribution on the left hand side of equation (27).

$$M = e^{m_1 + \frac{\sigma_1^2}{2}} + e^{m_2 + \frac{\sigma_2^2}{2}} + \ldots + e^{m_n + \frac{\sigma_n^2}{2}} \qquad (28)$$

$$V = e^{2m_1}\left(e^{2\sigma_1^2} - e^{\sigma_1^2}\right) + e^{2m_2}\left(e^{2\sigma_2^2} - e^{\sigma_2^2}\right) + \ldots + e^{2m_n}\left(e^{2\sigma_n^2} - e^{\sigma_n^2}\right) \qquad (29)$$

Further new notation is introduced: m(Z) denotes the average of a normal random variable Z, and $\sigma(Z)$ the standard deviation. The average of a distribution on the right hand side of equation (27) is written as equation (30) and the deviation as equation (31).

$$e^{m(Z) + \frac{\sigma(Z)^2}{2}} \qquad (30)$$

$$e^{2m(Z)}\left(e^{2\sigma(Z)^2} - e^{\sigma(Z)^2}\right) \qquad (31)$$

In Wilkinson's approximation, equation (28) is deemed equal to equation (30), and equation (29) is deemed equal to equation (31) so that the average m(Z) and the standard deviation $\sigma(Z)$ are calculated. The solutions of such equations are given by equation (32) and (33). M is given by equation (34) and V is given by equation (35).

$$m(Z) = \frac{1}{2}\log\left(\frac{M^4}{M^2 + V}\right) \qquad (32)$$

$$\sigma(Z) = \sqrt{\log\left(\frac{M^2 + V}{M^2}\right)} \qquad (33)$$

$$M = e^{m_1 + \frac{\sigma_1^2}{2}} + e^{m_2 + \frac{\sigma_2^2}{2}} + \ldots + e^{m_n + \frac{\sigma_n^2}{2}} \qquad (34)$$

$$V = e^{2m_1}\left(e^{2\sigma_1^2} - e^{\sigma_1^2}\right) + e^{2m_2}\left(e^{2\sigma_2^2} - e^{\sigma_2^2}\right) + \ldots + e^{2m_n}\left(e^{2\sigma_n^2} - e^{\sigma_n^2}\right) \qquad (35)$$

Equation (4) can be transformed into equation (36) below with Wilkinson's approximation, where $\alpha_1$ to $\alpha_3$ are independent normal random variables.

$$e^{b\alpha_1} + e^{b\alpha_2} + e^{b\alpha_3} \approx e^Z \qquad (36)$$

The average and the standard deviation of normal random variable Z included in equation (36) are written as equation (37) and (38) below in light of equation (32) and (33), where m is the average of normal random variable Z and $\sigma$ is the standard deviation of normal random variable Z. M is expressed with equation (39) below and V is expressed with equation (40) below.

$$m = \frac{1}{2}\log\left(\frac{M^4}{M^2+V}\right) = \frac{1}{2}\log\left(\frac{3^3 e^{b^2}}{e^{b^2}+3-1}\right) \quad (37)$$

$$\sigma = \sqrt{\log\left(\frac{M^2+V}{M^2}\right)} = \sqrt{\log\left(\frac{e^{b^2}+3-1}{3}\right)} \quad (38)$$

$$M = 3e^{\frac{b^2}{2}} \quad (39)$$

$$V = 3\left(e_2^{2b} - e^{b^2}\right) \quad (40)$$

From the discussion above, an equation "$e^z = e^{m+\sigma\alpha}$" is obtained; whereby multiple first fluctuation parameters $\alpha_1$, $\alpha_2$, and $\alpha_3$ can be converted into one first fluctuation parameter $\alpha$ as shown in equation (4).

Figure 8:
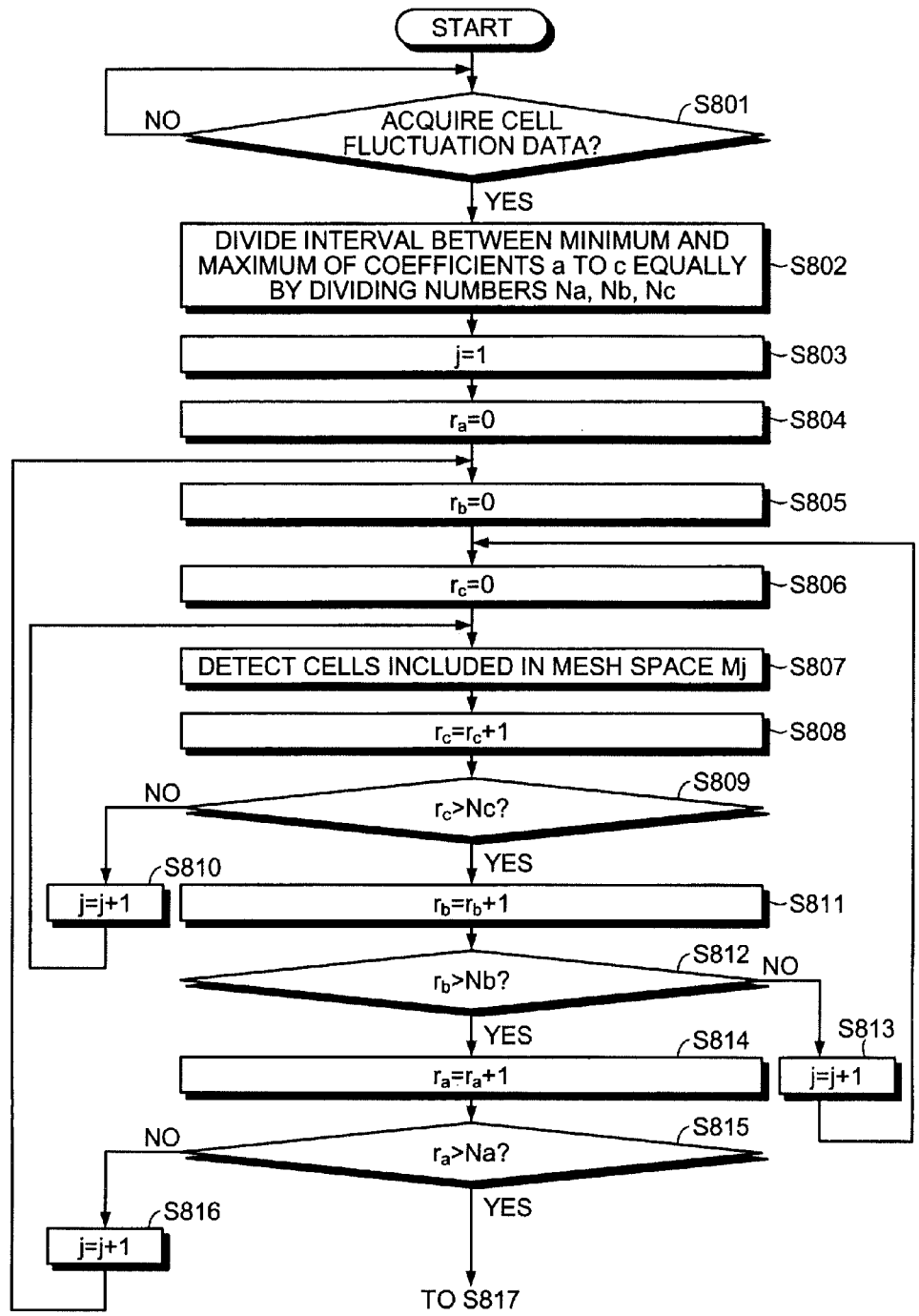
FIG. 8 and FIG. 9 are flowcharts depicting one example of a process of the analysis support apparatus.
Figure 9:
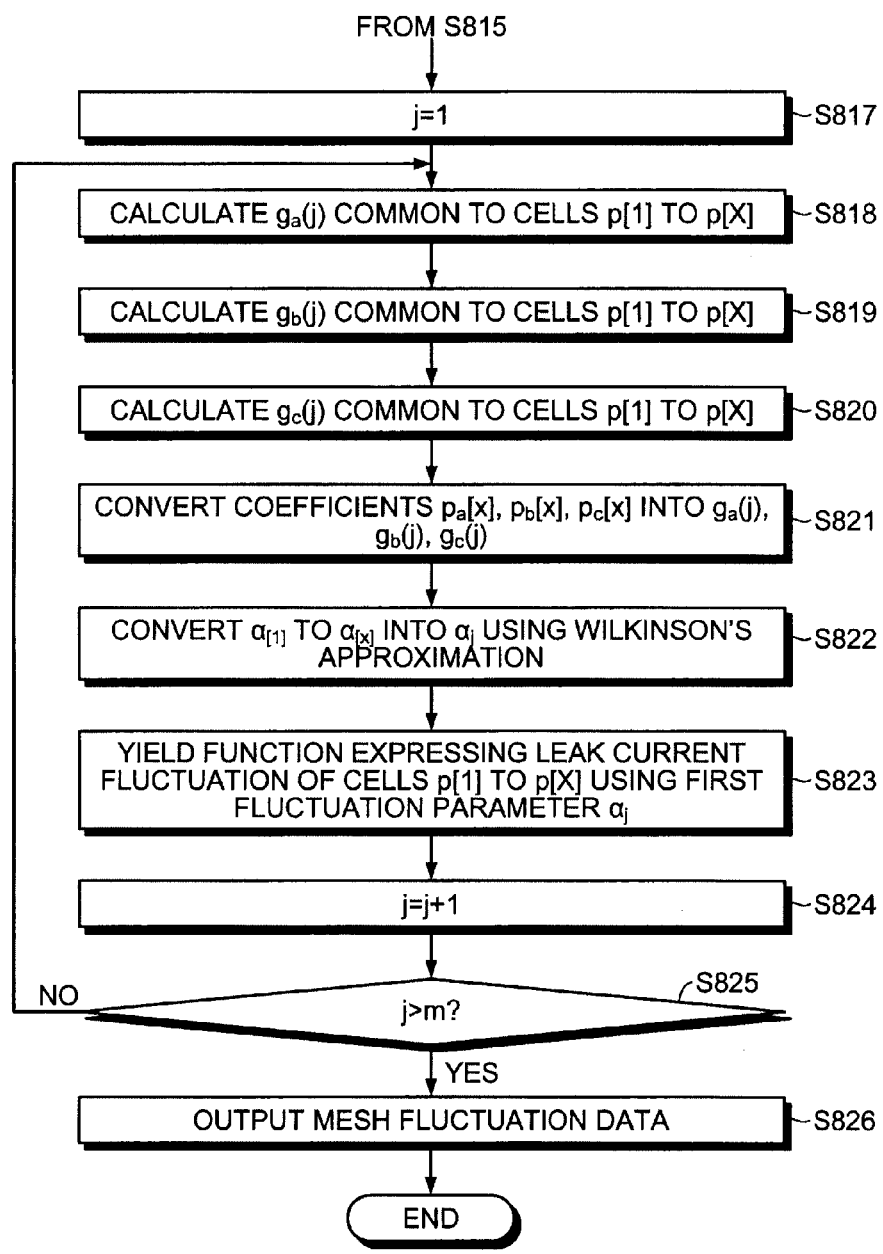

A process of an analysis support of the analysis support apparatus 200 is explained. FIG. 8 and FIG. 9 are flowcharts depicting one example of a process of the analysis support apparatus. According to the flowchart of FIG. 8, it is determined whether the acquiring unit 401 has acquired cell fluctuation data 300-1 to 300-$n$ (step S801).

The process waits until the acquiring unit 401 acquires cell fluctuation data 300-1 to 300-$n$ (step S801: NO). When the cell fluctuation data 300-1 to 300-$n$ are acquired (step S801: YES), the dividing unit 403 divides an interval between the minimum and the maximum of each of coefficients a, b, and c equally according to the dividing number $N_a$, $N_b$, and $N_c$ (step S802).

The detecting unit 402 sets "j" of the mesh space $M_j$ as "j=1" (step S803). The detecting unit 402 sets the coordinates of the mesh space $M_j$ as "$r_a$=0" (step S804), "$r_b$=0" (step S805), and "$r_c$=0" (step S806).

The detecting unit 402 detects cells p[1] to p[X] in the mesh space $M_j$ (step S807). The detecting unit 402 increments $r_c$ (step S808) and determines whether $r_c > N_c$ (step S809).

If $r_c \leq N_c$ (step S809: NO), the detecting unit 402 increments j (step S810) and the process returns to step S807. If $r_c > N_c$ (step S809: YES), the detecting unit 402 increments $r_b$ (step S811) and determines whether $r_b > N_b$ (step S812).

If $r_b \leq N_b$ (step S812: NO), the detecting unit 402 increments j (step S813) and the process returns to step S806. If $r_b > N_b$ (step S812: YES), the detecting unit 402 increments $r_a$ (step S814) and determines whether $r_a > N_a$ (step S815).

If $r_a \leq N_a$ (step S815: NO), the detecting unit 402 increments j (step S816) and the process returns to step S805. If $r_a > N_a$ (step S815: YES), the process goes to step S817 depicted in FIG. 9.

According to the flowchart of FIG. 9, the coefficient calculating unit 404 sets "j" of the mesh space $M_j$ as "j=1" (step S817). The coefficient calculating unit 404 calculates coefficient $g_a(j)$ common to cells p[1] to p[X] in the mesh space $M_j$ using equation (15) (step S818).

The coefficient calculating unit 404 calculates coefficient $g_b(j)$ common to cells p[1] to p[X] in the mesh space $M_j$ using equation (16) (step S819). The coefficient calculating unit 404 calculates coefficient $g_c(j)$ common to cells p[1] to p[X] in the mesh space $M_j$ using equation (17) (step S820).

The converting unit 405 converts coefficients $p_a[x]$, $p_b[x]$, $p_c[x]$ in equation (18) into coefficients $g_a(j)$, $g_b(j)$, $g_c(i)$ (step S821). As a result, equation (18) is converted into equation (19).

The converting unit 405 converts first fluctuation parameters $\alpha_{[1]}$ to $\alpha_{[x]}$ into one first fluctuation parameter $\alpha_j$ using Wilkinson's approximation (step S822). As a result, equation (19) is converted into equation (20). A(j) and B(j) in equation (20) are set in the "coefficient A" field and the "coefficient B" field for the mesh space $M_j$ in the mesh fluctuation data table 600.

The converting unit 405, using the first fluctuation parameter $\alpha_j$, yields a function that expresses fluctuation of leak current of cells p[1] to p[X] (step S823). As a result, equation (23) is obtained. C(j) in equation (23) is set in the "coefficient C" field for the mesh space $M_j$ in the mesh fluctuation data table 600.

The coefficient calculating unit 404 increments j (step S824) and determines whether j>m (step S825). If j≤m (step S825: NO), the process returns to step S818.

If j>m (step S825: YES), the output unit 408 outputs the mesh fluctuation data 600-1 to 600-$m$ of the mesh fluctuation data table 600 (step S826) and the process ends.

In this way, cells $C_1$ to $C_n$ in the circuit under test are classified into cell groups each having an identical or similar characteristic, and terms in a function (polynomial) that expresses fluctuation of leak current in a cell group can be reduced.

Figure 10:
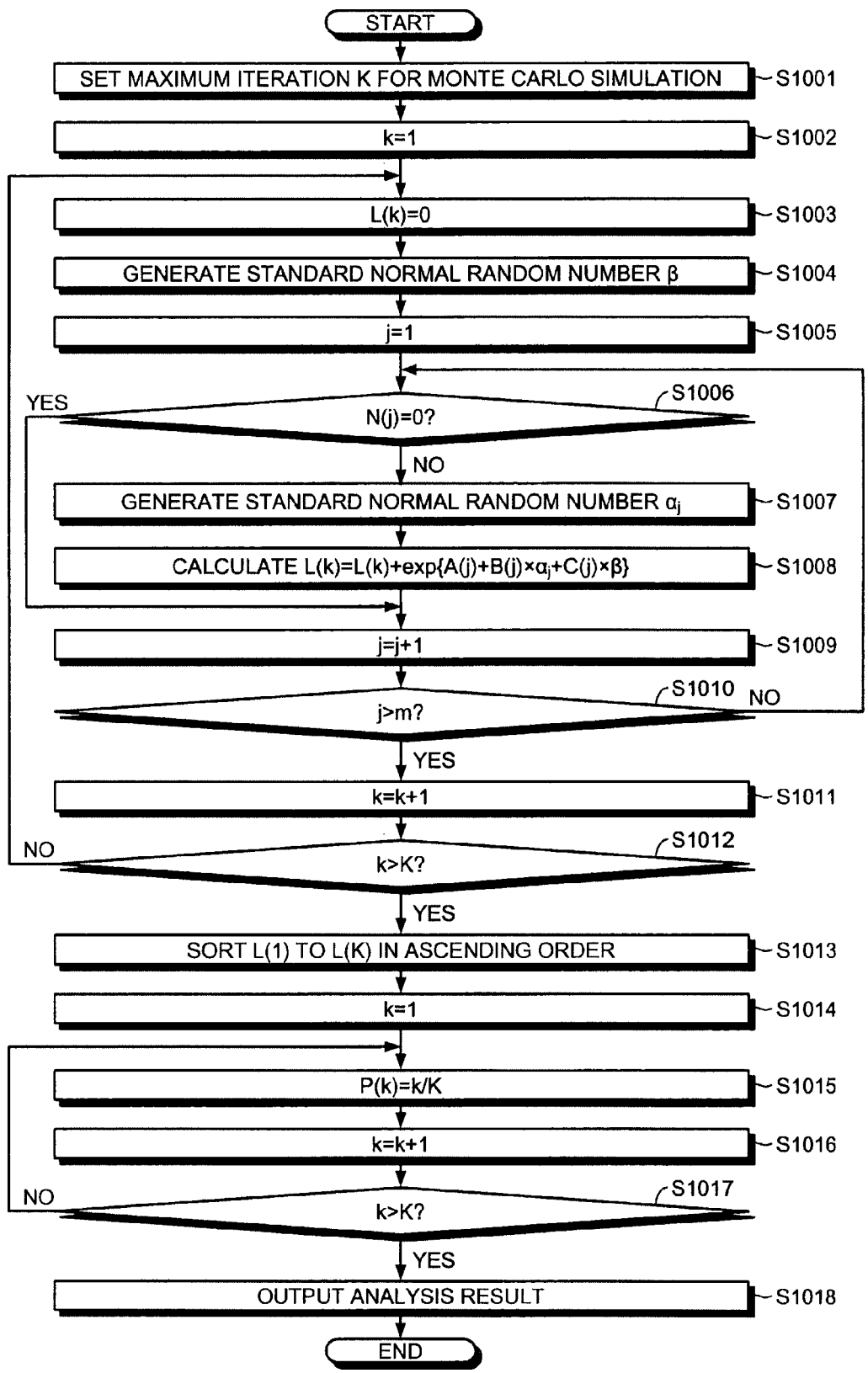
FIG. 10 is a flowchart depicting one example of a process of leak current calculation at a leak calculating unit.

A process of leak current calculation at the leak calculating unit 407 is explained. FIG. 10 is a flowchart depicting one example of a process of leak current calculation at the leak calculating unit 407. The process of leak current calculation explained below may be executed by an external simulator.

According to the flowchart of FIG. 10, the leak calculating unit 407 sets the number of iterations K for a Monte Carlo simulation (step S1001). Maximum iterations K is set beforehand and stored in a storage device such as the ROM 202, the RAM 203, the magnetic disk 205, and the optical disk 207.

The leak calculating unit 407 sets iteration k as k=1 (step S1002) and leak current L(k) of the circuit under test as L(k)=0 (step S1003). The leak calculating unit 407 generates a standard normal random number β (average=0, standard deviation=1) (step S1004). β is a second fluctuation parameter common to all cells $C_1$ to $C_n$ in the circuit under test.

The leak calculating unit 407 sets j of the mesh space $M_j$ as j=1 (step S1005). With reference to the mesh fluctuation data table 600, the leak calculating unit 407 determines whether the number of cells N(j)=0 (step S1006).

If N(j)=0 (step S1006: YES), the process goes to step S1009. If N(j)≠0 (step S1006: NO), the leak calculating unit 407 generates a standard normal random number $\alpha_j$ (step S1007). $\alpha_j$ is a first fluctuation parameter unique to cells p[1] to p[X] in the mesh space $M_j$.

With reference to the mesh fluctuation data table 600, the leak calculating unit 407 calculates L(k), using equation (23), as L(k)=L(k)+exp{A(j)+B(j)×$\alpha_j$+C(j)×β} (step S1008).

The leak calculating unit 407 increments j (step S1009) and determines whether j>m (step S1010). If j≤m (step S1010: NO), the process returns to step S1006.

If j>m (step S1010: YES), the leak calculating unit 407 increments k (step S1011) and determines whether k>K (step S1012). If (step S1012: NO), the process returns to step S1003.

If k>K (step S1012: YES), the leak calculating unit 407 sorts L(1) to L(K) in ascending order (step S1013).

The leak calculating unit 407 set k as k=1 (step S1014) and calculates cumulative probability P(k)=k/K (step S1015).

The leak calculating unit 407 increments k (step S1016) and determines whether k>K (step S1017). If k≤K (step S1017: NO), the process returns to step S1015.

If k>K (step S1017: YES), the output unit 408 outputs the analysis result 700 that associates leak current L(k) with cumulative probability P(k) (step S1018) and the process ends.

In this way, a cumulative probability density distribution concerning leak current of the circuit under test (for example, the analysis result 700) can be obtained.

Further, since leak current of a cell group having an identical or similar characteristic is expressed with collective fluctuation, the amount of calculation for random number generation, exponent calculation, multiplication, addition, etc. can be reduced. In addition, since the mesh space $M_j$ of "$N(j)=0$" is excluded at step S1006, the amount of calculation for random number generation, exponent calculation, multiplication, addition, etc. can be reduced even further.

As explained above, according to the embodiments, cells having identical or nearly identical coefficients a, b, and c that are unique to each cell $C_i$ are detected as a cell group having an identical or similar characteristic. Furthermore, according to the embodiments, random variables that express fluctuation of leak current unique to each cell $C_i$ of the cell group are converted into one random variable so that a function expressing fluctuation of leak current in the cell group can be obtained. Consequently, the number of terms in a function expressing fluctuation of leak current in the circuit under test can be reduced.

According to the embodiments, coefficients $g_a(j)$ to $g_c(j)$ common to all cells in the mesh space $M_j$ are calculated so that random variables expressing fluctuation of leak current unique to cell p[x] in the mesh space $M_j$ can be converted into one random variable.

According to the embodiments, with a function (equation (20)) expressing fluctuation of leak current for a unit in the mesh space, leak current of the circuit under test is calculated so that the processing time for statistical leak current analysis can be reduced. More specifically, by classifying cells having an identical or similar characteristic by units of the mesh space, the number of terms in a function expressing fluctuation of leak current in the circuit under test can be reduced from n terms (equal to the number of cells) to m terms (equal to the number of mesh space). As a result, the processing speed becomes about n/m times faster.

When the leak current analysis of the circuit under test is performed, mesh space $M_j$ that does not include a single cell $C_i$ is excluded from the analysis so that the number of terms in a function expressing leak current fluctuation can be reduced further. For example, when cells $C_i$ have thousands of identical or similar characteristics, terms corresponding to tens million or hundreds million cells can be reduced to three orders of magnitude corresponding to the number of mesh space. As a result, the processing time for leak current analysis of the circuit under test can be shortened further.

The method explained in the present embodiment can be implemented by a computer, such as a personal computer and a workstation, executing a program that is prepared in advance. The program is recorded on a computer-readable, non-transitory medium such as a hard disk, a flexible disk, a CD-ROM, an MO, and a DVD, and is executed by being read out from the recording medium by a computer. The program can be a transmission medium that can be distributed through a network such as the Internet.

The analysis support apparatus 200 described in the present embodiments can be realized by an application specific integrated circuit (ASIC) such as a standard cell or a structured ASIC, or a programmable logic device (PLD) such as a field-programmable gate array (FPGA). Specifically, for example, functional units (acquiring unit 401 to output unit 408) of the analysis support apparatus 200 are defined in hardware description language (HDL), which is logically synthesized and applied to the ASIC, the PLD, etc., thereby enabling manufacture of the analysis support apparatus 200.

As set forth above, according to the embodiments, the processing time for the leak current analysis of the circuit under test can be shortened.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A computer-readable, non-transitory medium storing a program causing a computer to execute a process, the process comprising:
    acquiring a unique coefficient that is unique to a device in a circuit under test and is included in a function expressing fluctuation of leak current of the device;
    detecting as a group, and based on the unique coefficient, devices having an identical type and having a difference in driving capability that falls within a given range;
    converting first random variables into a single second random variable, the first random variables expressing fluctuation of leak current unique to each of the detected devices;
    yielding a function that expresses fluctuation of leak current of the detected devices, using the second random variable; and
    outputting the yielded function.

2. The medium according to claim 1, the process further comprising:
    calculating a common coefficient that is common to the detected devices, based on the unique coefficient of each detected device,
    wherein at the converting, the first random variables are converted into a single second random variable, based on the common coefficient.

3. The medium according to claim 1, the process further comprising:
    calculating leak current of the circuit under test, based on the yielded function,
    wherein at the outputting, the calculated leak current is output.

4. The medium according to claim 1, the process further comprising:
    dividing into segments, each interval between the maximum value and the minimum value of each unique coefficient,
    wherein at the detecting, devices that belong to a same segment are detected as the group.

5. The medium according to claim 4,
    wherein at the acquiring, a first and a second unique coefficients that are unique to a device in the circuit under test and included in the function expressing fluctuation of leak current of the device are acquired,
    wherein at the dividing, an interval between the minimum value and the maximum value of the first unique coefficient and an interval between the minimum value and the maximum value of the second unique coefficient are divided into segments,
    wherein at the detecting, devices that belong to a same space defined by the segments are detected as the group.

6. The medium according to claim 5, wherein
at the dividing, the interval of the first unique coefficient is divided equally into multiple segments and the interval of the second unique coefficient is divided so that a given value of leak current is divided evenly.

7. An analysis support apparatus comprising:
an acquiring unit that acquires a unique coefficient that is unique to a device in a circuit under test and is included in a function expressing fluctuation of leak current of the device;
a detecting unit that detects as a group, and based on the unique coefficient, devices having an identical type and having a difference in driving capability that falls within a given range;
a converting unit that converts first random variables into a single second random variable, the first random variables expressing fluctuation of leak current unique to each of the detected devices;
a yielding unit that yields a function that expresses fluctuation of leak current of the detected devices, using the second random variable; and
an output unit that outputs the yielded function.

8. An analysis support apparatus comprising:
a processor to execute a procedure, the procedure comprising:
acquiring a unique coefficient that is unique to a device in a circuit under test and is included in a function expressing fluctuation of leak current of the device;
detecting as a group, and based on the unique coefficient, devices having an identical type and having a difference in driving capability that falls within a given range;
converting first random variables into a single second random variable, the first random variables expressing fluctuation of leak current unique to each of the detected devices;
yielding a function that expresses fluctuation of leak current of the detected devices, using the second random variable; and
outputting the yielded function.

9. An analysis support method comprising:
acquiring a unique coefficient that is unique to a device in a circuit under test and is included in a function expressing fluctuation of leak current of the device;
detecting as a group, and based on the unique coefficient, devices having an identical type and having a difference in driving capability that falls within a given range;
converting first random variables into a single second random variable, the first random variables expressing fluctuation of leak current unique to each of the detected devices;
yielding a function that expresses fluctuation of leak current of the detected devices, using the second random variable; and
outputting the yielded function.

* * * * *